United States Patent
Chung et al.

(10) Patent No.: US 7,547,480 B2
(45) Date of Patent: Jun. 16, 2009

(54) MAGNETIC TUNNEL JUNCTION PRESSURE SENSORS AND METHODS

(75) Inventors: Young Sir Chung, Chandler, AZ (US);
Robert W. Baird, Gilbert, AZ (US);
Bradley N. Engel, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 522 days.

(21) Appl. No.: 11/262,064

(22) Filed: Oct. 28, 2005

(65) Prior Publication Data
US 2007/0099031 A1    May 3, 2007

(51) Int. Cl.
*H01L 43/02* (2006.01)
*G01L 9/04* (2006.01)
*G01L 9/14* (2006.01)
*G01L 9/16* (2006.01)

(52) U.S. Cl. ............ 428/811.1; 428/811.5; 73/862.625; 73/719; 73/720; 338/14; 338/32 R; 338/42

(58) Field of Classification Search ............. None
See application file for complete search history.

(56) References Cited

U.S. PATENT DOCUMENTS

| | | | |
|---|---|---|---|
| 4,967,598 A * | 11/1990 | Wakatsuki et al. | 73/514.12 |
| 6,484,585 B1 * | 11/2002 | Sittler et al. | 73/718 |
| 6,694,822 B1 * | 2/2004 | Ganapathi et al. | 73/763 |
| 6,889,555 B1 * | 5/2005 | Ganapathi | 73/728 |
| 7,059,201 B2 * | 6/2006 | Prakash et al. | 73/862.041 |
| 7,220,602 B2 * | 5/2007 | Chung et al. | 438/3 |
| 7,239,543 B2 * | 7/2007 | Chung et al. | 365/158 |
| 7,271,011 B2 * | 9/2007 | Chung et al. | 438/3 |
| 7,414,396 B2 * | 8/2008 | Chung et al. | 324/244 |
| 2004/0185675 A1 | 9/2004 | Lu et al. | |
| 2005/0199072 A1 | 9/2005 | Ganapathi | |
| 2007/0022598 A1 * | 2/2007 | Chung et al. | 29/603.13 |
| 2007/0025027 A1 * | 2/2007 | Chung et al. | 360/324.2 |
| 2007/0076330 A1 * | 4/2007 | Chung et al. | 360/324.2 |
| 2007/0077664 A1 * | 4/2007 | Chung et al. | 438/2 |
| 2007/0159735 A1 * | 7/2007 | Butcher et al. | 360/324.2 |

OTHER PUBLICATIONS

M. Lohndorf et al., "Strain Sensors Based on Magnetostrictive GMR/TMR Structures," IEEE Transactions on Magnetics, vol. 38, No. 5., Sep. 2002, pp. 2826-2828.
H. Li et al., "Microelectromechanical System Microbridge Deflection Monitoring Using Integrated Spin Valve Sensors and Micromagnets," Journal of Applied Physics, vol. 91, No. 19, May 15, 2002, pp. 7774-7776.
Reohr, William et al.; "Memories of Tomorrow"; IEEE Circuits and Design Magazine; Sep. 2002; pp. 17-27; IEEE.
International Search Report and Written Opinion (dated Feb. 26, 2008).

* cited by examiner

*Primary Examiner*—Kevin M Bernatz
(74) *Attorney, Agent, or Firm*—Ingrassia Fisher & Lorenz, P.C.

(57) ABSTRACT

An integrated circuit device is provided which comprises a substrate, a conductive line configured to experience a pressure, and a magnetic tunnel junction ("MTJ") core formed between the substrate and the current line. The conductive line is configured to move in response to the pressure, and carries a current which generates a magnetic field. The MTJ core has a resistance value which varies based on the magnetic field. The resistance of the MTJ core therefore varies with respect to changes in the pressure. The MTJ core is configured to produce an electrical output signal which varies as a function of the pressure.

20 Claims, 7 Drawing Sheets

MAGNETIC TUNNEL JUNCTION PRESSURE SENSORS AND METHODS

TECHNICAL FIELD

The present invention relates generally to electronic devices. More particularly, the present invention relates to integrated circuit (IC) devices which implement magnetic tunnel junctions (MTJs) as pressure sensors or magnetic tunnel junction pressure sensors (MTJ-PSs) for sensing pressure experienced by the MTJ pressure sensor.

BACKGROUND

Magnetoresistive Random Access Memory (MRAM) is a nonvolatile memory technology that uses magnetic polarization to store data, in contrast to other RAM technologies that use electronic charges to store data. One primary benefit of MRAM is that it retains the stored data in the absence of applied system power, thus, it is a nonvolatile memory. Generally, MRAM includes a large number of magnetic cells formed on a semiconductor substrate, where each cell represents one data bit. Information is written to a cell by changing the magnetization direction of the magnetic free layer within the cell, and a bit is read by measuring the resistance of the cell (low resistance typically represents a "0" bit and high resistance typically represents a "1" bit).

An MRAM device generally includes an array of cells that are interconnected using conductive bit lines, conductive digit lines, and/or local interconnects and the like. Practical MRAM devices are fabricated using known semiconductor process technologies. For example, the bit and digit lines are formed from different metal layers, which are separated by one or more insulating and/or additional metal layers. Conventional fabrication processes allow distinct MRAM devices to be easily fabricated on a substrate.

Smart power integrated circuits are single-chip devices capable of managing and providing operating power in a controlled and intelligent manner. Smart power integrated circuits typically include one or more active circuit components, such as, a power circuit component, an analog control component, and/or a digital logic component. Smart power integrated circuits may also include one or more sensors which can be used to measure or detect physical parameters such as position, motion, force, acceleration, temperature, pressure and so forth. Such sensors can be used, for example, to control the output power in response to changing operating conditions. For example, in cell phones, smart power products can be engineered to regulate power consumption, amplify audio signals, and supply power to color screens. In inkjet printers, smart power products can help drive the motors and fire the nozzles for ink delivery. In automobiles, smart power products can help control engine and braking systems, airbag deployments, and seat positioning. Smart power products can also be implemented in a wide variety of other applications.

For integrated circuits (IC's) pressure sensing is an important element of IC design to provide an integrated solution for sensors and circuits. Existing pressure sensors for measuring the pressure suffer from various limitations. For example, many pressure sensing devices consume valuable semiconductor layout area or space. Other limitations of such sensing devices include, for example, excessive size/weight, inadequate measurement precision of the pressure experienced by the pressure sensor, inadequate sensitivity and/or dynamic range, high cost and limited reliability among other limitations.

Micro-Electrical Mechanical Systems (MEMS) integrate mechanical elements, sensors, actuators, and electronics on a common silicon substrate through microfabrication technology. MEMS convert a physical input into an electrical output signal. Typical types of MEMS devices are made of piezoresistive devices or capacitive devices. Resistance of a piezoresistor changes when it the piezoresistor is bent or strained. A piezoresistor can be used to create a piezoresistive pressure sensor which consists of a silicon diaphragm integrated in a silicon substrate. The sensitivity of MEMS based pressure sensors to subtle pressure variations is somewhat limited since the changes in pressure required to register a change in output are relatively large. Moreover, because such piezoresistive pressure sensors are typically integrated in a silicon substrate they tend to consume valuable silicon substrate space.

The miniaturization of many modern applications make it desirable to shrink the physical size of electronic devices, integrate multiple components or devices into a single chip, and/or improve circuit layout efficiency. Ideally, sensors should be manufactured in a cost effective manner which reduces the additional layout area or space the sensors consumes. It would be desirable to have a semiconductor-based device which includes, for example, a MRAM architecture integrated with a smart power architecture including sensor components on a single substrate, particularly where the MRAM architecture, sensor components and the smart power architecture are fabricated using the same process technology. Thus, there continues to be a need for improved pressure sensors.

Accordingly, it is desirable to provide an improved pressure sensor and method, adaptable for measuring or sensing pressure experienced by the pressure sensor. It is further desirable that the improved pressure sensor and method generates an electrical signal that can be converted to a pressure experienced by the pressure sensor. It would be desirable to provide pressure sensors that can be easily integrated with semiconductor devices and integrated circuits (e.g., pressure sensors which are compatible with semiconductor device and integrated circuit structures and fabrication methods). For example, it would be very desirable to provide pressure sensors which exhibit precision measurement and improved measurement performance and which can be integrated in a three-dimensional architecture to conserve lay out area and allow for processing in a cost effective manner. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques and features related to MRAM design, MRAM operation, semiconductor device fabrication, and other aspects of the integrated circuit devices may not be described in detail herein. Furthermore, the circuit/component layouts and configurations shown in the various figures contained herein are intended to represent example embodiments of the invention. It should be noted that many alternative or additional circuit/component layouts may be present in a practical embodiment.

The following description may refer to elements or features being "connected" or "coupled" together. As used herein, unless expressly stated otherwise, "connected" means that one element/feature is directly joined to (or directly communicates with) another element/feature, and not necessarily mechanically. Likewise, unless expressly stated otherwise, "coupled" means that one element/feature is directly or indirectly joined to (or directly or indirectly communicates with) another element/feature, and not necessarily mechanically.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

A practical MRAM architecture can be formed on a substrate using a suitable semiconductor fabrication process. In practice, MRAM structures described herein can be formed using a conventional MRAM fabrication process. A practical MRAM device will typically include millions of cells. Generally, an MRAM architecture includes at least one digit line formed from one metal layer, at least one bit line formed from another metal layer, and a magnetic tunnel junction ("MTJ") core formed between the two metal layers. The MTJ core includes cells that form an array of memory locations for the MRAM architecture.

Figure 1:
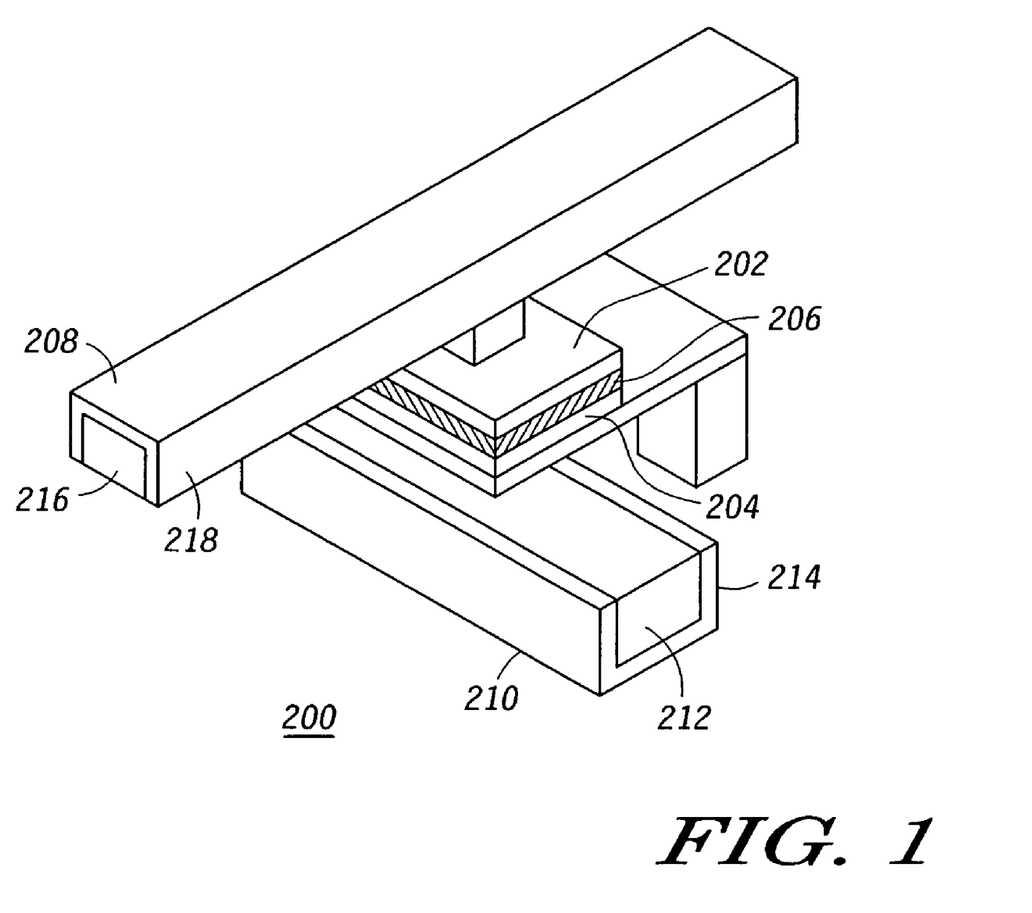
FIG. 1 is a schematic perspective view of an MRAM cell configured according to an exemplary embodiment.

FIG. 1 is a schematic perspective view of an MRAM cell 200 configured according to an exemplary embodiment. Each cell in an MRAM architecture may be configured as shown in FIG. 1. MRAM cell 200 generally includes either an upper ferromagnetic or synthetic antiferromagnetic ("SAF") layer 202, or a lower ferromagnetic or SAF layer 204, and a tunnel barrier layer 206 between the two ferromagnetic layers. In this example, the upper ferromagnetic or SAF layer 202 composes the free magnetic layer because the direction of its magnetization can be switched to change the bit status of cell 200. Lower ferromagnetic or SAF layer 204, however, is the fixed magnetic layer because the direction of its magnetization is pinned in one direction and does not change direction of polarization during normal operating conditions. When the magnetization in upper ferromagnetic or SAF layer 202 is parallel to the magnetization in lower ferromagnetic layer 204, the resistance across cell 200 is in its low resistance state. When the magnetization in upper ferromagnetic layer 202 is anti-parallel to the magnetization in lower ferromagnetic layer 204, the resistance across cell 200 is in its high resistance state. The data ("0" or "1") in a given cell 200 is read by measuring the resistance of the cell 200. The techniques utilized to read and write data to MRAM cell 200 are known to those skilled in the art and, therefore, will not be described in detail herein.

FIG. 1 also depicts a bit line 208 and a digit line 210 (individually and collectively referred to herein as "program lines") corresponding to cell 200. The orientation of the magnetization in free magnetic layer 202 rotates in response to applied current pulses from the digit and bit lines for toggle applications and makes a complete 180 degree reversal when both digit and bit line pulses are properly applied for the single magnetic free layer (or conventional) application. In a typical non-toggle MRAM, the orientation of the bit is switched by reversing the polarity of the current in bit line 208 while keeping a constant polarity of the current in digit line 210. In a practical deployment, bit line 208 may be connected to any number of similar MRAM cells (e.g., a column of cells) to provide a common write current to each of the connected cells. Similarly, digit line 210 may be associated with any number of similar MRAM cells (e.g., a row of cells) to provide a common digit current to each of the cells.

In the embodiment shown in FIG. 1, magnetic cladding or shielding layers 214, 218 can be provided to improve sensitivity, stability and reduce signal noise/interference due to routings adjacent to the MRAM cell. In this example, digit line 210 includes a conductive digit element 212 and a permeable cladding material 214 formed from a soft magnetic material. In this example, cladding 214 partially surrounds conductive element 212. In particular, cladding 214 is formed around three sides of conductive element 212 such that the upward facing surface of conductive element 212 remains uncladded. In the embodiment shown in FIG. 1, line 208 includes a conductive bit element 216 and cladding 218 formed from a permeable magnetic material. In this example, cladding 218 partially surrounds conductive element 216. In particular, cladding 218 is formed around three sides of conductive element 216 such that the downward facing surface of conductive element 216 remains uncladded. Cladding 214/218 may be utilized to focus the magnetic flux toward the MTJ to improve the efficiency of programming. The cladding has an additional benefit of reducing the write disturbance to neighboring bits. In practical embodiments, the magnetic cladding is an integral part of the barrier layers used in the fabrication of copper program lines used in the MRAM process.

In practical embodiments, conductive element 212 and conductive element 216 are formed from an electrically conductive material such as copper, and cladding 214/218 is formed from a soft, permeable magnetic material such as NiFe, a nickel-iron-cobalt alloy, a cobalt-iron alloy, or the like. In one example embodiment, cladding 214/218 is approximately 200~300 Angstroms thick (the sidewalls of cladding 214/218 may be slightly thinner). Although the conductive elements and the cladding are realized from different materials, conductive element 212 and cladding 214 are considered to be fabricated at one common metal layer (e.g., the metal four layer), and conductive element 216 and cladding 218 are considered to be fabricated at another common metal layer (e.g., the metal five layer).

The terms "first metal layer" and "second metal layer" may be used herein to differentiate between any two distinct metal layers, and "first metal layer" and "second metal layer" need not indicate the metal one and metal two layers, respectively. In other words, a "first metal layer" means any metal layer within a described integrated circuit device, regardless of any arbitrary layer numbering scheme, and a "second metal layer" means any other metal layer within the described integrated circuit device, regardless of any arbitrary layer numbering scheme.

Smart power integrated circuits can be fabricated using a combinational CMOS process that integrates precision analog, power devices, and logic or a subset of the blocks. Smart power integrated circuits can reduce various components and combine all those functions into a single cost-effective IC including functions of voltage regulation, power MOSFETs, input signal conditioning, transient protection, system diagnostics, and control. ICs using smart power integrated circuits contain various functions, such as power ICs, communication, power management, safety and sensors, and many other special functions. Smart power integrated circuits feature a rich set of mixed signal building blocks including A/D and D/A converters, rail-to-rail op amps, comparators, charge pumps and gate drives, voltage regulators, precision references, digital logic, and non-volatile memory. For driving loads there are power MOSFET devices with inductive energy clamps, independent thermal management, short circuit protection, and diagnostic load sensing.

Figure 2:
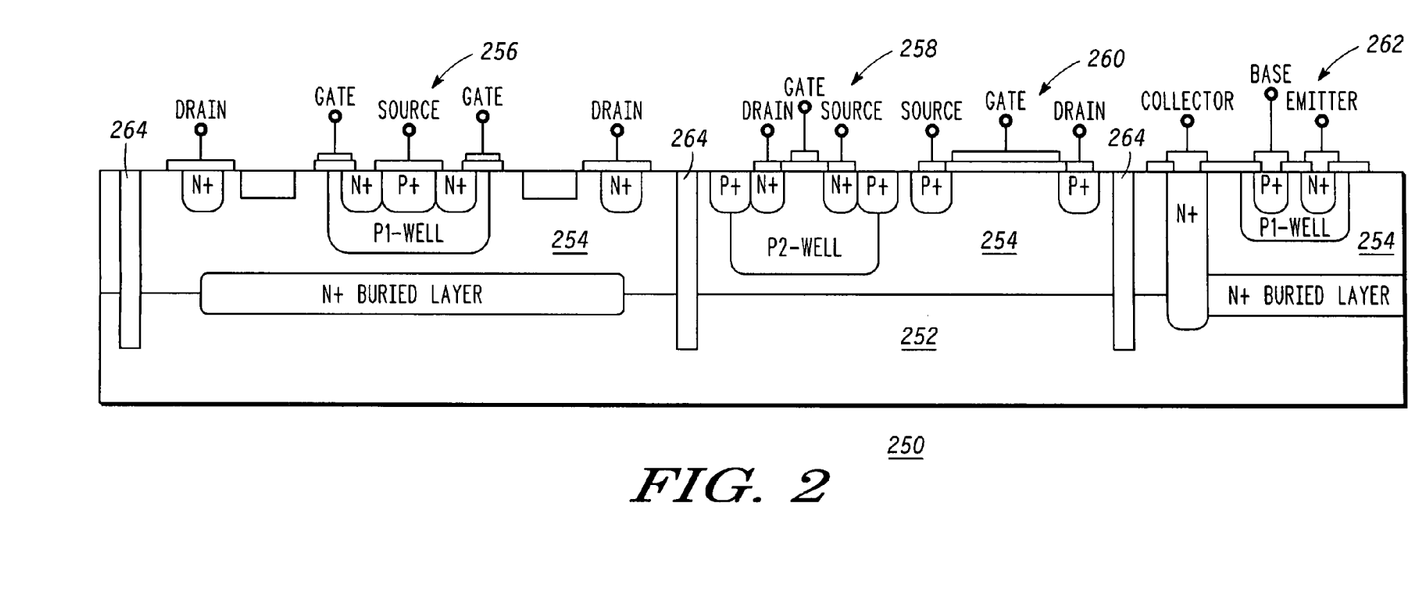
FIG. 2 is a schematic sectional view of a simplified smart power integrated circuit architecture.

FIG. 2 is a schematic view of a simplified smart power integrated circuit architecture 250, which, as an example, is formed on a substrate 252 with an n-epi layer 254 using a suitable semiconductor fabrication process. Smart power integrated circuits can be formed on various types of substrates with and/or without epitaxial layers, employing n-type or p-types. In practice, smart power integrated circuit architecture 250 and other structures described herein can be formed using any suitable integrated circuit fabrication process. Although smart power integrated circuit architecture 250 is depicted with power MOSFET 256, CMOS (n-MOSFET 258 and p-MOSFET 260), and bipolar devices 262, a practical smart power integrated circuit will typically include various active and passive components, such as diodes, resistors, capacitors, inductors, fuses, anti-fuses, and memory devices. Generally, smart power integrated circuit architecture 250 includes at least one metal layer, and additional metal layers are added to increase the circuit density and to enhance circuit performance. Various n-type and p-types wells are formed using well-known semiconductor processing, such as implantation and diffusion. Isolation components 264 could be realized using any suitable oxidation and/or trench process.

An embodiment of the invention relates to an integrated circuit device formed on a common substrate and having an MRAM architecture combined with a smart power architecture, where at least a portion of the MRAM architecture and at least a portion of the smart power architecture are concurrently formed by the same fabrication process. As used herein, a smart power architecture includes a power circuit component configured to manage electrical power and at least one additional component configured to control, regulate, monitor, affect, or react to the operation of the power circuit. In practice, the power circuit component may include power transistors, and the at least one additional component may include, without limitation: a sensor (e.g., an environmental condition sensor, an electromagnetic sensor, an electromechanical sensor, an electrical attribute sensor, a transducer, or the like); a power control component; an analog component; a digital logic component; or any combination thereof. Using smart power integrated circuits, designers can reduce the size of the analog portion and the digital logic of practical applications to achieve dense circuitry. This enables designers to economically pack more features and capability into a chip, resulting in reduced die area, reduced cost, and improved performance. This integration helps designers of automotive systems, industrial controls, and consumer electronics simplify system design, lower system cost, and improve reliability.

Figure 3:
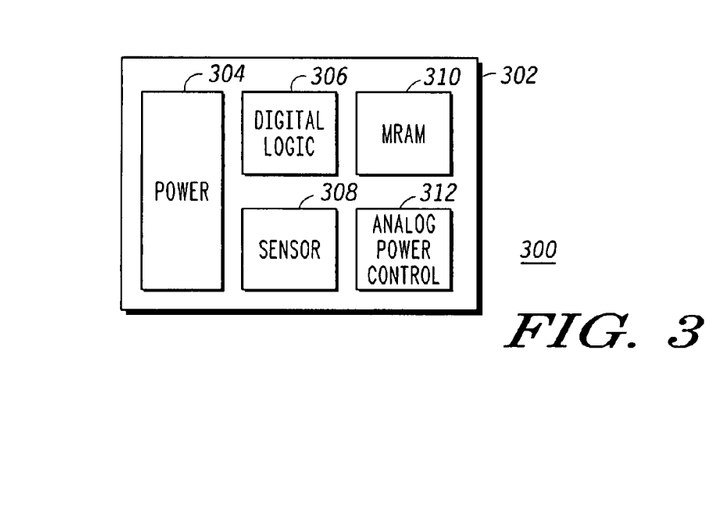
FIG. 3 is a schematic representation of an integrated circuit device configured according to an exemplary embodiment.

FIG. 3 is a schematic representation of an integrated circuit device 300 configured according to an exemplary embodiment. Integrated circuit device 300 generally includes a substrate 302 upon which a number of functional components are formed. Substrate 302 may be any suitable semiconductor material, such as a silicon-based material. The functional components are schematically depicted as blocks in FIG. 3 for ease of illustration. In this example, these functional components include a power circuit component 304, a digital logic component 306, a sensor architecture 308, an MRAM architecture 310, and an analog control components 312. Although not shown in FIG. 3, integrated circuit device 300 may include additional components as necessary to satisfy the needs of the particular application. In practice, some of these functional components may be coupled together to enable cooperative operation. For example, power circuit component 304, digital logic component 306, sensor architecture 308, and analog control component 312 may cooperate to form a smart power architecture for integrated circuit device 300. In this regard, these components (individually or in any combination thereof) are also referred to herein as "smart power components." MRAM architecture 310, however, need not be coupled to the other components and MRAM architecture 310 may be configured to function as an independent subsystem of integrated circuit device 300. The embedding of MRAM architecture 310 into a smart power integrated circuit in this manner results in an efficient use of physical space while enabling the fabrication of sensors from layers that are traditionally utilized only in connection with the MTJ core of an MRAM.

In one practical embodiment of the invention, power circuit component 304 includes one or more high power MOSFET devices that are configured to operate at high voltages to generate high temperatures. Alternate embodiments may employ different power generation devices and techniques for power circuit component 304. Digital logic component 306 may be realized with CMOS transistors or any suitable digital logic arrangement. Digital logic component 306 is configured to carry out the digital operations that support the smart power architecture of integrated circuit device 300. Analog control component 312 includes analog circuit components configured to support the smart power architecture of integrated circuit device 300. Analog control component 312 may include, for example, resistors, capacitors, inductors, MOSFETs, bipolar devices, and/or other analog circuit elements.

Sensor architecture 308 is generally configured to sense one or more physical, electrical, magnetic, environmental, or other conditions for integrated circuit device 300. In this example, integrated circuit device 300 uses the quantity, characteristic, parameter, or phenomena detected by sensor architecture 308 to regulate, control, manage, or monitor the output power generated by power circuit component 304. In this regard, sensor architecture 308 may employ one or more sensors or sensor components, including, without limitation: an electromagnetic sensor; an electromechanical sensor, such as a transducer; a mechanical sensor, such as a vibration sensor, an accelerometer, a stress/strain sensor, pressure sensor, temperature sensor, current sensor or the like.

Figure 4:
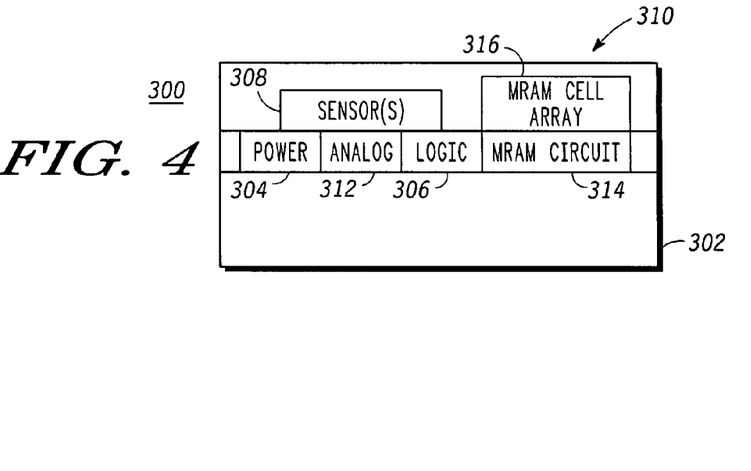
FIG. 4 is a schematic cross sectional representation of the integrated circuit device shown in FIG. 3.

MRAM architecture 310 may be generally configured as described above in connection with FIGS. 1 and 2. Indeed, integrated circuit device 300 may employ conventional MRAM designs and techniques for MRAM architecture 310, and such conventional features will not be described in detail herein. Generally, MRAM architecture 310 includes an MRAM circuit component 314 and an MRAM cell array 316 coupled to MRAM circuit component 314 (see FIG. 4, which is a schematic cross sectional representation of integrated circuit device 300). MRAM circuit component 314 may include any number of elements or features that support the operation of MRAM architecture 310, including, without limitation: switching transistors; input/output circuitry; a decoder; comparators; sense amplifiers, or the like. FIG. 4 is a simplified diagram that generally depicts the topological arrangement of the functional components of integrated circuit device 300. In this regard, FIG. 4 illustrates that MRAM architecture 310 is formed on substrate 302, and that the smart power architecture (including power circuit component 304, digital logic component 316, sensor architecture 308, and analog control component 312 in this example) is formed on substrate 302. FIG. 4 also illustrates that MRAM cell array 316 is formed above MRAM circuit component 314.

In one exemplary embodiment of the invention, integrated circuit device 300 is manufactured using a modular process technology having a front end fabrication process and a back end fabrication process. In this context, the front end fabrication process is performed first in time and is completed before the back end process is initiated. As used herein, the front end fabrication process is associated with the formation of elements or features using "front end layers," which may be N and/or P doped regions within a semiconductor substrate 302, dielectric layers, or other layers, while the back end fabrication process is associated with the formation of elements or features using "back end layers," which may be metal or conductive layers, dielectric layers, MTJ core layers, or other layers. Thus, the front end layers are located in or on the substrate 302, and the back end layers are located above the front end layers. In practice, the front end and back end fabrication processes may utilize well known masking, implantation, diffusion, reactive ion etching, physical sputtering, damascene patterning, physical vapor deposition, electroplating, chemical vapor, and/or plasma enhanced chemical vapor deposition techniques. For example, an integrated circuit as described herein may be manufactured using a process technology that can leverage CMOS, bipolar, or other suitable fabrication processes.

FIG. 4 is a simplified diagram of components and elements of integrated circuit device 300 configured according to an exemplary embodiment. A practical embodiment of integrated circuit device 300 may include additional layers (e.g., metal layers, dielectric layers, and/or a ground plane) than that shown in FIG. 4. In this example, power circuit component 304, analog control component 312, digital logic component 306, and MRAM circuit component 314 are suitably formed by the front end fabrication process from front end layers. Some or all of these front end components may be concurrently formed by the front end fabrication process. In contrast, sensor architecture 308 (which may include one or more sensors) and MRAM cell array 316 are suitably formed by the back end fabrication process from back end layers. Some or all of these back end components may be concurrently formed by the back end fabrication process. In practice, the front end and back end fabrication processes are modules in the MRAM fabrication process employed to create MRAM architecture 310. Thus, the manufacture of integrated circuit device 300 leverages the existing MRAM fabrication process for purposes of the smart power architecture. In this manner, at least a portion of the smart power architecture and at least a portion of MRAM architecture 310 can be concurrently formed by the chosen MRAM fabrication process.

Figure 5:
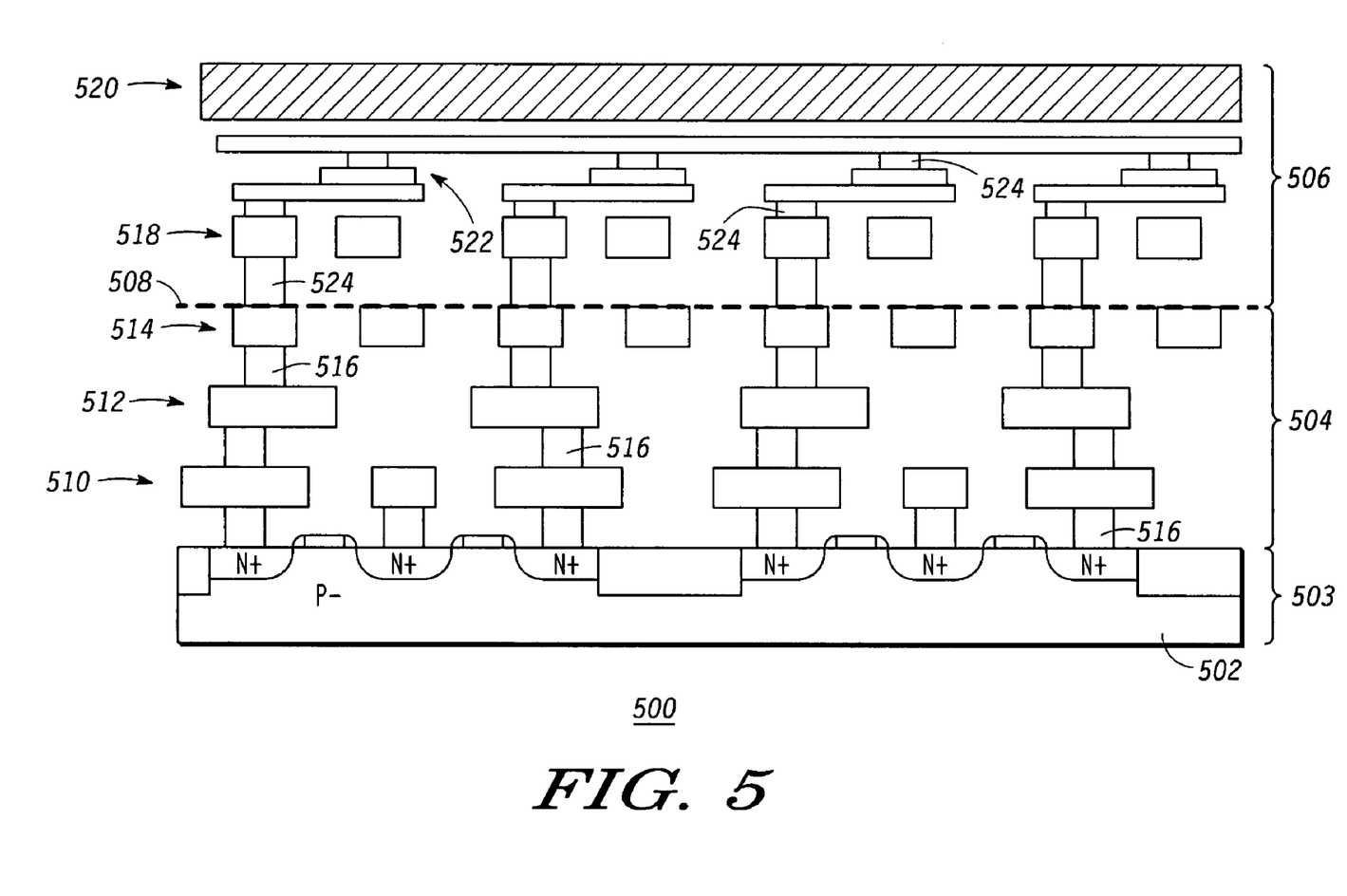
FIG. 5 is a schematic cross sectional representation of an integrated circuit device configured according to an exemplary embodiment.

FIG. 5 is a schematic cross sectional representation of an integrated circuit device 500 configured according to an exemplary embodiment. Integrated circuit device 300 may employ the general structure depicted in FIG. 5. Integrated circuit device 500 represents an example MRAM embedded smart power integrated circuit fabricated in the manner described herein. Integrated circuit device 500 generally includes a substrate 502, front end layers 503 formed in or on substrate 502, and first back end layers 504 and second back end layers 506 formed above front end layers 503. A dashed line 508 in FIG. 5 represents an imaginary dividing line between the first back end fabrication process and the second back end fabrication process.

In one practical embodiment of the invention, first back end layers 503 of integrated circuit device 500 may include a metal-one layer 510, a metal-two layer 512, a metal-three layer 514, intervening dielectric layers (not separately shown in FIG. 5), conductive vias 516 routed between layers, and the like, while second back end layers 506 of integrated circuit device 500 may include a metal-four layer 518, a metal-five layer 520, an MTJ core "layer" 522, intervening dielectric layers (not separately shown in FIG. 5), conductive vias 524 routed between layers, and the like. As described above, an MTJ core may be realized by more than one layer of material. For the sake of simplicity, however, FIG. 5 depicts the MTJ core as a single "layer" 522. In other embodiments of the invention, integrated circuit device 500 might include more or less front end layers and/or more or less back end layers.

In the example embodiment, power circuit component 304, analog control component 312, digital logic component 306, and MRAM circuit component 314 are formed using elements created from metal-one layer 510, metal-two layer 512, and/or metal-three layer 514, while sensor architecture 308 and MRAM cell array 316 are formed using elements created from metal-four layer 518, metal-five layer 520, and/or MTJ layer 522. MRAM cell array 316 includes a plurality of bit lines formed on metal-five layer 520, a plurality of digit lines formed on metal-four layer 518, and an array of MTJ cells (the MTJ core layer 522 forms the MTJ cells) formed between metal-four layer 518 and metal-five layer 520. In this example, sensor architecture 308 includes a sensor component that is also formed from MTJ core layer 522. In practice, this sensor component is created with the same back end fabrication process used for the creation of MRAM cell array 316. Sensor architecture 308 may also include an additional sensor component (not shown) that is formed from metal-four layer 518 and/or from metal-five layer 520. Such additional sensor components may represent conductive traces, control circuitry, biasing circuitry, or the like.

A sensor in sensor architecture 308 is suitably configured (along with cooperating circuitry or features if necessary) to suit the needs of the particular application. The sensor, which is fabricated from MTJ core layer 522, is designed such that variations in certain operating conditions cause a related change in the electrical, magnetic, electromagnetic, electromechanical, and/or other characteristics of the sensor. For example, an MTJ-based device, such as an MTJ core, can be configured to sense changes in pressure experienced by the MTJ pressure core. The MTJ pressure sensor senses a magnetic field produced by a nearby conductor. The magnetic field sensed by the MTJ core changes as the distance between the nearby conductor and the MTJ core changes. For example, as the conductor moves closer to the MTJ core, the output resistance (Rout) of the MTJ core increases, and as the conductor moves further away from the MTJ core, the output resistance (Rout) of the MTJ core decreases.

MTJ Pressure Sensor Implementation

For integrated circuits (IC's), pressure sensing is a critical element of IC design since it can protect the circuit, device or system. Many IC designs require high precision pressure sensing. In contrast to conventional practices for sensing pressure, the disclosed techniques use a magnetic tunnel junction (MTJ) device as a pressure sensor. Magnetic tunnel junction pressure sensors can provide precision measurement and sensitivity, compatibility, and capability for three-dimensional integration with integrated circuits.

Figure 6:
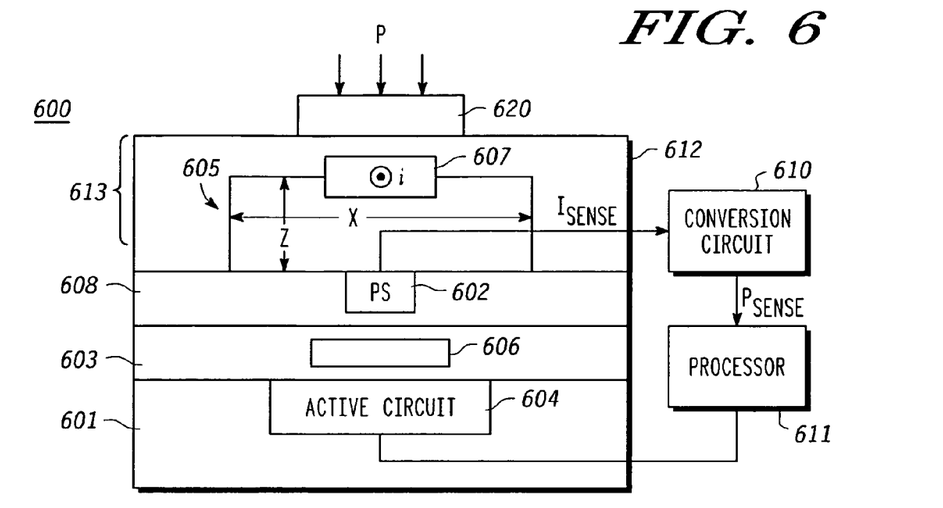
FIG. 6 is a simplified cross-sectional diagram of an integrated circuit device configured according to an exemplary embodiment.

FIG. 6 is a simplified cross-sectional diagram of an integrated circuit device 600 configured according to an exemplary embodiment.

The integrated circuit device 600 or "magnetic tunnel junction pressure sensor (MTJ-PS)" comprises a substrate 601 having an active circuit 604 embedded therein, insulating layer 603 having a conductive line 606 embedded therein, an insulating layer 608 having a MTJ core 602 therein, a deformable diaphragm 613 formed of an insulating layer 612 and having a conductive line 607 at least partially embedded in the insulating layer 612, an optional magnetic shielding layer 620, a pressure sensor conversion circuit 610 and a processor 611. The insulating layer 612 also defines a cavity 605. Moreover, a practical embodiment of integrated circuit device 600 may include additional layers (e.g., metal layers, dielectric layers, and/or a ground plane) other than those shown in FIG. 6.

Figure 7:
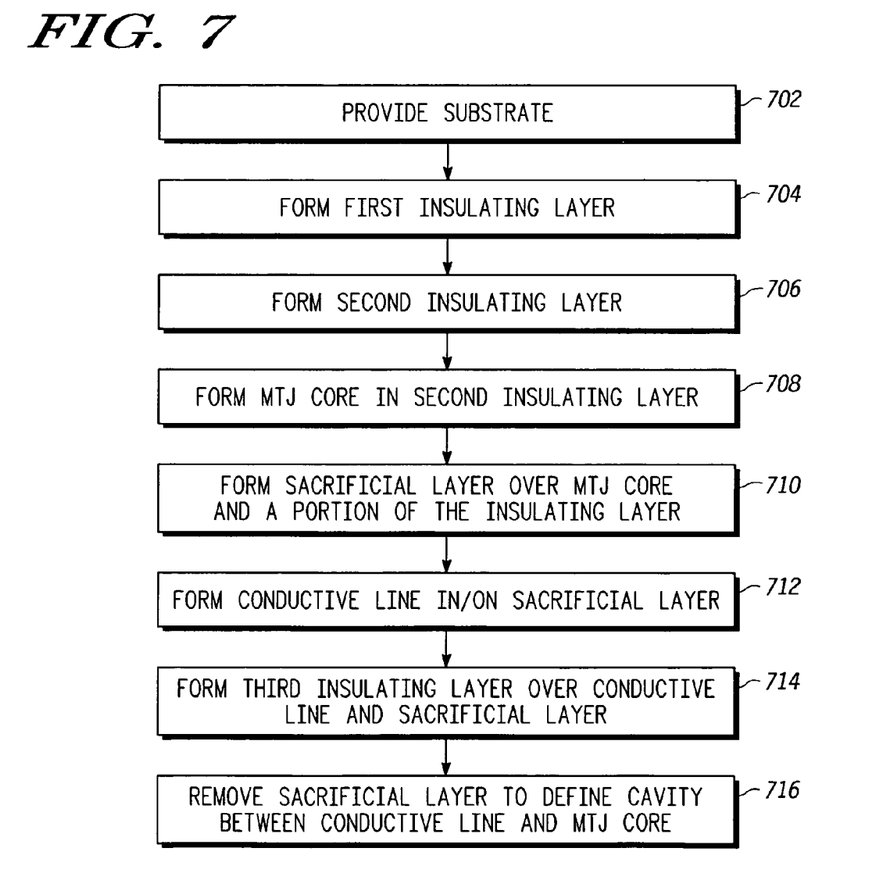
FIG. 7 is a flowchart showing a method of fabricating an MTJ pressure sensor according to an exemplary embodiment.

FIG. 7 is a flowchart showing a method of fabricating integrated circuit device 600 according to an exemplary embodiment and will be described with reference to FIGS. 6 and 8.

At step 702, the substrate 601 is provided using known semiconductor processing techniques. The substrate 601 may optionally have an active circuit 604 formed therein. The active circuit 604 can comprise, for example, active circuit components or devices, such as, smart power or analog integrated circuits. The substrate 601 and active circuit 604 are formed from front end layers by a front end fabrication process. At step 704, the insulating layer 603, such as an interlayer dielectric (ILD), can then be formed above the substrate 601 and the active circuit 604 using known semiconductor processing techniques. The insulating layer 603 can also have a conductive line 606 formed therein, such as a digit line. The conductive line can be formed, for example, via physical vapor deposition and electroplating to deposit, for example, from copper or copper based alloys. At step 706, the insulating layer 608 can then be formed above the insulating layer 603 and the conductive line 606 using known semiconductor processing techniques.

At step 708, the MTJ core 602 is then formed in the insulating layer 608 by a multi-step fabrication process. The MTJ core 602 is formed from back end layers by a back end fabrication process which occurs after the front end fabrication process Although the MTJ core 602 is shown as being embedded in the insulating layer 608, it should be appreciated that the MTJ core 602 can generally be integrated anywhere within the integrated circuit device to monitor pressure. For example, the MTJ core 602 can be located anywhere below the cavity 605 and within the insulating layer 408. The structure of an exemplary, non-limiting MTJ core 602 can be shown in greater detail in FIG. 8, as will be discussed in further detail below.

At step 710, a sacrificial layer (not shown) is then formed over the MTJ core 602 and a portion of the insulting layer 608. The sacrificial layer is eventually removed to define the cavity 605, and therefore determines the eventual dimensions of the cavity 605.

At step 712, the conductive line 607 can then be formed in or on the sacrificial layer. The sacrificial layer holds the conductive line 607 in place until insulating layer 612 is formed and can hold the conductive line 607 above the eventual cavity 605 created by removal of the sacrificial layer.

At step 714, the insulating layer 612 is then formed over the conductive line 607 and sacrificial layer such that it at least partially surrounds the conductive line 607 and sacrificial layer. Because the insulating layer 612 eventually forms the deformable diaphragm 613 it should be formed of a material which can compress under pressure yet at the same time be resilient from breakage. The insulating layer 612 may comprise a layer of insulating material which can be made, for example, of materials such as silicon nitride or silicon dioxide.

After the insulating layer 612 is formed, at step 716, the cavity 605 can be formed by removing the sacrificial layer to define the cavity 605 between the conductive line 607 and the MTJ core 602.

The cavity 605 is defined in the space formerly occupied by the sacrificial layer between the MTJ core 602 and the insulating layer 608. The cavity 605 has dimensions including a vertical distance or cavity dimension (z) between conductive line 607 and MTJ core 602, and horizontal distance or cavity dimension (x) between sidewalls of the cavity 605. At least a portion of the cavity 605 is disposed between the conductive line 607 and the MTJ core 602. The cavity provides a depression space for the conductive line 607 as pressure (P) is applied to the overall structure 600.

The remaining portions of the insulating layer 612 comprise the deformable diaphragm 613 which has the conductive line 607 at least partially disposed or embedded therein. The deformable diaphragm 613 acts as the holding material for the conductive line 607 which suspends the conductive line 607 over the cavity 605. The conductive line 607 and insulating layer 612 are positioned or configured such that they can experience a pressure (P), and move or flex in response to changes in pressure (P). Thereafter, although not shown in FIG. 7, the thick magnetic shielding layer 620 can optionally be formed above the deformable diaphragm 613. The thick magnetic shielding layer 620 is placed above the MTJ core 602 to protect the MTJ core 602 from external noise so that the MTJ core 602 senses the particular pressures which are experienced by the MTJ core 602. The additional thick magnetic shielding layer 620 can protect electrical output signals of the MTJ core 802, including the current signal (Isense), from external noise caused by external sources. This can allow for more precise measurements. The magnetic shielding layer 620 improves the signal noise and stability of the MTJ output resistance (Rout) by eliminating signal interferences due to current routings adjacent the MTJ core 602. The magnetic shielding layer 620 reduces the effects of unwanted the magnetic fields in the regions where the electrical output signals of the MTJ core 802 including the current signal (Isense) can be susceptible to external noise. The MTJ pressure sensor can produce even more precise measurements when the noise is reduced due to the magnetic shielding layer 620.

Figure 8:
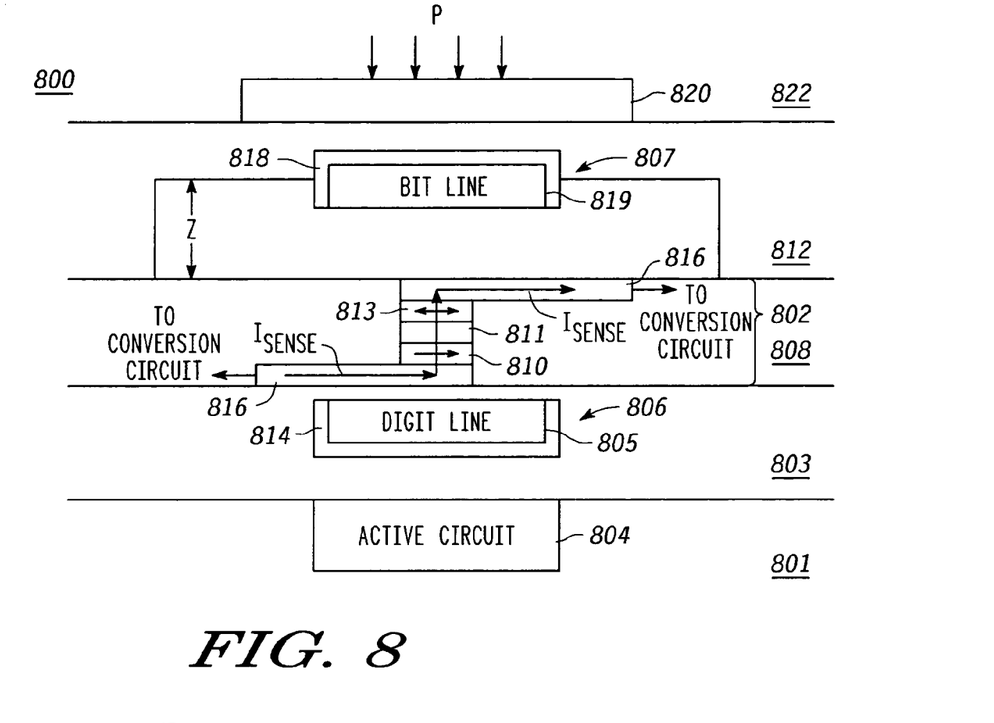
FIG. 8 is a simplified cross-sectional diagram of an integrated circuit configured according to an exemplary embodiment.

FIG. 8 is a simplified cross-sectional diagram of an integrated circuit 800 configured according to an exemplary embodiment which implements a MTJ core 802 for sensing pressure experienced by the MTJ core 802.

The integrated circuit 800 comprises a substrate 801, the MTJ core 802, a first insulating layer 803, a digit line (DL) 806, a second insulating layer 808, a third insulating layer 812, a bit line (BL) 807, a fourth insulating layer 822, and an optional magnetic shielding layer 820. The structure of the integrated circuit 800 is similar to the integrated circuit device 600 shown in FIG. 6. The substrate 801, the first insulating layer 803, second insulating layer 808, the third insulating layer 812, and the optional magnetic shielding layer 820 are similar to corresponding elements in FIG. 6. Accordingly, these elements will not be described again. The MTJ core 802, the digit line (DL) 806, and the bit line (BL) 807 include additional features that will now be described in greater detail with reference to FIG. 8.

The MRAM core 802 comprises a free layer 813, a tunnel barrier layer 811, a pinned layer 810, and electrode layers 816. The "free" layer 813 can be formed of either an upper ferromagnetic or synthetic antiferromagnetic ("SAF") layer, the "pinned" layer 810 can be formed of either a lower ferromagnetic or SAF layer, and the tunnel barrier layer 811 can be disposed between the free layer 813 and the pinned layer 810 such that it sits between the free layer 813 and the pinned layer 810. The pinned layer 810 can be made of a NiFe material and can have a fixed orientation of magnetization (to the right in FIG. 8). The free layer 813 can be made of NiFe, and unlike the pinned layer, the orientation of the magnetization in the free layer can rotate as indicated by the arrows shown in FIG. 8. The tunnel barrier layer 811 "tunnels" current from the pinned layer 810 to the free layer 813 and may comprise an oxide. Electrode 816 sits below the pinned layer 810, while another electrode 816 sits above the free layer 813. It should be appreciated that a variety of MTJ core structures exist and all are within the scope of the present invention. The example in FIG. 8 is provided merely for showing one possible structure of the MTJ core 602.

FIG. 8 also depicts a digit line 806 and a bit line 807 (individually and collectively referred to herein as conductive lines or "program lines"). Magnetic cladding or shielding layers 814, 818 can optionally be provided to improve sensitivity, stability and reduce signal noise/interference due to routings adjacent to the MTJ core 602. In this example, digit line 806 includes a conductive digit element 805 and a permeable cladding material 814 formed from a soft magnetic material. The cladding 814 partially surrounds conductive element 805 around three sides of conductive element 805 such that the upward facing surface of conductive element 805 remains uncladded. Bit line 807 includes a conductive bit element 819 and cladding 818 formed from a permeable magnetic material. The cladding 818 partially surrounds conductive element 819 around three sides of conductive element 819 such that the downward facing surface of conductive element 819 remains uncladded. Cladding 814, 818 may be utilized to focus the magnetic flux toward the MTJ to improve the efficiency of programming. The cladding 814, 818 has an additional benefit of reducing the write disturbance to neighboring bits. In practical embodiments, the magnetic cladding 814, 818 is an integral part of the barrier layers used in the fabrication of copper program lines used in the MRAM process.

In practical embodiments, conductive element 805 and conductive element 819 are formed from an electrically conductive material such as copper, and cladding 814/818 is formed from a soft, permeable magnetic material such as NiFe, a nickel-iron-cobalt alloy, a cobalt-iron alloy, or the like. Although the conductive elements 805, 819 and the cladding 814, 818 can be realized from different materials, conductive element 805 and cladding 814 are considered to be fabricated at one common metal layer (e.g., the metal four layer), and conductive element 820 and cladding 818 are considered to be fabricated at another common metal layer (e.g., the metal five layer).

As noted above, the free magnetic layer 813 and the pinned magnetic layer 810 are made of a magnetic materials such as NiFe. Magnetization occurs during processing by combining certain materials in the presence of a magnetic field. In the pinned magnetic layer 810, the orientation of the magnetization is typically constant or fixed in one direction. For instance, in FIG. 8, the orientation of the magnetization of the pinned magnetic layer 810 is shown as pointing right. By contrast, the magnetization orientation in the free magnetic layer 813 can change in both magnitude and direction, for example, from 0° to 180°.

A mutual angle between the free magnetic layer 813 and the pinned magnetic layer 810 can be defined as the orientation of magnetization of the free layer 813 with respect to the pinned layer 810, or vice-versa. The mutual angle between the free magnetic layer 813 and the pinned magnetic layer 810 depends on the orientation of magnetization within the free magnetic layer 813 with respect to the pinned magnetic layer 810. Based on this mutual angle, the MTJ core 813 can operate in at least two different states.

One state, sometimes referred to as a parallel state, takes place when the magnetizations of the free layer 813 and the pinned layer 810 are oriented in the same direction and the mutual angle between the free layer 813 and the pinned layer 810 is 0°. In the parallel state, the tunneling magnetic resistance (TMR) of the MTJ core 813 exhibits a relatively low resistance. By contrast, another state, sometimes referred to as an anti-parallel state, takes place when the magnetizations of the free layer 813 and the pinned layer 810 are oriented in opposite directions and the mutual angle between the free layer 813 and the pinned layer 810 is 180°. This occurs, for example, when the magnetization of the free layer 813 is to the left and the magnetization of the pinned layer 810 to the right. In the anti-parallel state, the TMR of the MTJ core 813 exhibits a relatively high resistance.

Both the bit line 807 and the digit line 806 may conduct current. The currents flowing within the bit line 807 and/or the digital line 806 cause or generate corresponding magnetic fields. The magnetic fields can alter or change the mutual angle between the free layer 813 and the pinned layer 810. As such, a change in either of the currents flowing within the bit line 807 and/or the digital line 806 will influence the mutual angle of the MTJ core 802. The strength of the magnetic field experienced by the MTJ core 802 is dependent upon the current running through the bit line 807 and/or the digit line 806 as well as the distance between the MTJ core 802 and the bit line 807 and/or the digit line 806. The distance between the MTJ core 802 and the bit line 807 and/or the digit line 806 can be controlled during the fabrication process. As will be described further below, by modifying the distance between the MTJ core 802 and the bit line 807 and/or the digit line 806, the sensitivity of the pressure sensor may be adjusted to fit design needs.

Changing the mutual angle of the MTJ core 802 alters or changes the output TMR (Rout) of the MTJ core 802. Stated differently, the magnetic field sensed by the MTJ core 802 can influence the output TMR (Rout) of the MTJ core 802. The magnetic tunnel junction core 802 can therefore be used to convert the magnetic field caused by the bit line 807 and/or the digital line 806 into an output tunnel magnetic resistance (TMR). By monitoring fluctuations in current (Isense) or other electrical output signal of the MTJ core 802, changes in the output TMR (Rout) of the MTJ core 802 may also be monitored. As will be described below, in one implementation, changes in the output TMR (Rout) of the MTJ core 802 can be used to determine changes in pressure (P).

Referring again to FIG. 6, as noted above, the conductive line 607 is suspended above the cavity 605. The conductive line 607 carries a current (i) and produces a magnetic field. In one implementation, the conductive line 607 can be, for example, a bit line which carries a current (i) to various devices such as MRAM components. In this particular schematic, current (i) flows out of the page, and causes or generates a magnetic field which can be sensed by the MTJ core 602. The magnetic field can alter or change the mutual angle between the free layer and the pinned layer of the MTJ core 602. As such, a change in either of the current flowing within the conductive line 607 or a change in the magnetic field strength experienced by the MTJ core (e.g., due to changes of the relative position of the conductive line 607 with respect to the MTJ core 602) can influence the mutual angle of the MTJ core 602. This changes the output TMR of the MTJ core 602. Thus, the MTJ core 602 can sense the magnetic field caused by the conductive line 607 (e.g., bit line and/or the digital line) as a corresponding output tunnel magnetic resistance or TMR (Rout) of the MTJ core 602.

As pressure (P) applied to deformable diaphragm 613 changes, the relative position of the conductive line 607 with respect to the MTJ core 602, or vertical distance (z), also changes. The MTJ core 602 experiences a change in the magnetic field since the conductive line 607 has either moved closer to or away from the MTJ core 602. Changes in magnetic field experienced by the MTJ core 602 changes the mutual angle between the pinned layer and the free layer of the MTJ core 602. The changes the mutual angle between the pinned layer and the free layer of the MTJ core 602 can be monitored as changes in the TMR (Rout) of the MTJ core 602. As such, pressure (P) changes can be monitored by monitoring the output resistance or TMR (Rout) of the MTJ core 602. The output resistance (Rout), and hence the output current (Isense) and other electrical output signals of the MTJ core 802, of an MTJ core 602 or "bit cell" varies predictably with pressure (P).

In one implementation, the MTJ core 602 can be used to covert the magnetic field into a corresponding TMR value. For example, when the insulating layer 612 flexes in response to pressure (P) applied to the insulating layer 612, a distance (z) between the conductive line 607 and the MTJ core 602 also changes. As such, the strength of the magnetic field which is experienced by the MTJ core 602 varies. Because the resistance value (Rout) of the MTJ core 602 varies with changes in the magnetic field experienced by the MTJ core 602, the resistance value (Rout) changes or varies with changes of the distance (z) between the conductive line 607 and the MTJ core 602. In other words, the resistance value (Rout) varies as a function of changes in pressure (P). Moreover, because the current (Isense) and other electrical output signals of the MTJ core 602 vary based on the resistance value (Rout) of the MTJ core 602, the current (Isense) or other electrical output signals of the MTJ core 602 can be used to detect variations in the resistance value (Rout), which can then be used to sense or determine pressure (P) experienced by the insulating layer 612.

Figure 9:
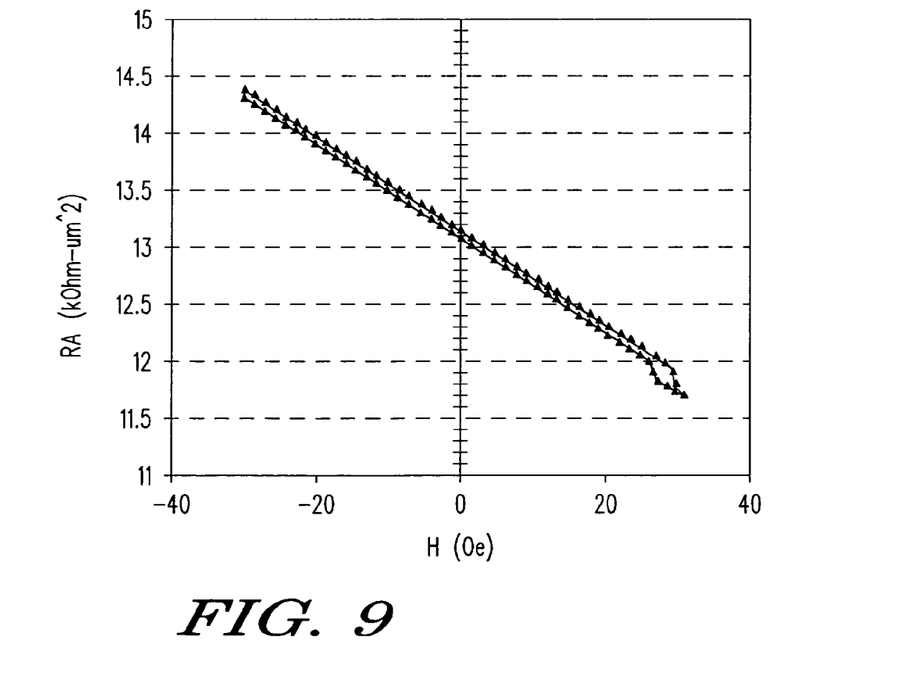
FIG. 9 is a chart illustrating output resistance (Rout) of a MTJ pressure sensor as a function of pressure experienced by the MTJ pressure sensor.

FIG. 9 is a chart illustrating output TMR (Rout) of a MTJ pressure sensor 600 as a function of pressure (P) experienced by the MTJ pressure sensor 600. In this chart, the x-axis denotes magnetic filed (H) in Oe, while the y-axis denotes tunnel magnetic resistance (TMR) of MTJs in kOhms-$\mu m^2$. The tunneling magnetic resistance (TMR) of MTJ core 602 varies as a function of magnetic field generated from the conductive line 607 which varies as a function of current produced by the conductive line 607 and the vertical distance (z) between MTJ core 602 and conductive line 607. The vertical distance (z) is a function of external pressure (P) applied to the deformable diaphragm 613 and the horizontal dimension (x) of the cavity 605. Because the horizontal dimension (x) of the cavity 605 can be structurally controlled during the fabrication process, the vertical distance (z) varies predictably with pressure (P) applied to the deformable diaphragm 613. When the magnetic field, vertical cavity dimension (z), horizontal cavity dimension (x), and acceleration (g) are constants, the output resistance or TMR (Rout) varies predictably with the pressure (P) experienced by the MTJ core 602. The superior pressure characteristics and properties of an MTJ make it ideal for use of an MTJ pressure sensor since it exhibits high-precision pressure sensing or monitoring capability.

Referring again to FIG. 6, the conductive lines 606, 607 can be used to initially program or set the resistance versus pressure characteristic of the MTJ core 602. For instance, in one implementation, an external field generated by the conductive line 606 and/or conductive line 607 can be used to set or program or change the pressure versus resistance characteristic of the MTJ core 607. This further allows the MTJ core 602 to be adapted to even accurately monitor the pressure experienced by the MTJ core 602. The MTJ core 602 can provide more precise pressure measurements than the conventional MEMS pressure sensing device.

It should be appreciated that the MTJ core can also be viewed as a "dummy MRAM cell." The use of MTJs as pressure sensors is relatively simple since the MTJ pressure sensor can be formed concurrently with MRAM cells thereby allowing "dummy" MTJ MRAM cells to be used as pressure sensors as opposed to non volatile memory (NVM). The term "dummy" is used herein to refer to MRAM cells used for sensing applications and distinguish the same from conventional MRAM cells used for information storage applications, such as, non-volatile memory (NVM). The MTJ core 602 is formed by a back end fabrication process from back end layers. In practice, the front end and back end fabrication processes are sub-processes in the MRAM fabrication process employed to create an MRAM architecture (not shown). Thus, the manufacture of integrated circuit device 600 leverages the existing MRAM fabrication process for purposes of creating a pressure sensor. Such MTJ pressure sensors offer excellent design flexibility since the MTJ pressure sensors can be integrated three-dimensionally. Importantly, in this implementation, the MTJ core (PS) 608 is disposed above the substrate layer 602 which can allow for 3-D integration and significant layout area savings. This can allow the sensors to be positioned peripherally, vertically or laterally within an integrated circuit (e.g., MRAM embedded SMOS power ICs). For example, the MTJ core 602 can be disposed anywhere above the substrate 601. This can allow for significant savings of die layout area. These properties can allow for processing in cost effective manner and improve the overall performance of the pressure sensor.

In one implementation, the pressure sensor conversion circuit 610 can be used to associate a value of the current (Isense) with a pressure (P) value experienced by the deformable diaphragm 613. In one embodiment, the conversion circuit 609 measures the output current (Isense) and uses the measured output current (Isense) to determine a corresponding output resistance (Rout) of the MTJ core 602. Because the relationship between the output resistance (Rout) of the MTJ device and the pressure (Psense) sensed by the MTJ device can be programmed and is known, the conversion circuit can determine the pressure (Psense) sensed by the MTJ device. Thus, the conversion circuit 609 can precisely associate the current (Isense) with a corresponding "sensed" pressure (Psense).

In one specific implementation, when the deformable diaphragm 613 is subjected to pressure (P), at least a portion of the deformable diaphragm 613 flexes such that the distance (z) between the conductive line 607 and the MTJ core 602 varies. This causes the magnetic field experienced by the MTJ core 602 to change in response to the pressure (P). Thereafter, a corresponding pressure value (Psense) can be determined based on the resistance value (Rout). The corresponding pressure value (Psense) is indicative of the pressure (P). The resistance value (Rout) of the MTJ core 602 varies with respect to the distance (z) between the conductive line 607 and the MTJ core 602, and also varies with respect to changes in the magnetic field experienced by the MTJ core 602.

As such, a corresponding pressure value (Psense) can be determined based on the resistance value (Rout), for example, by measuring the current (Isense), correlating the current (Isense) with a resistance value (Rout) of the MTJ core 602, and associating the resistance value (Rout) with a corresponding pressure value (Psense). The corresponding pressure value (Psense) is a sensed pressure which is indicative of the pressure (P).

The processor 611 can use the sensed pressure (Psense) to control operation of components (such as the active circuit 604) in the integrated circuit device 600.

As will now be described with respect to FIGS. 10-12 and with reference to FIG. 1, when implementing the MTJ core pressure sensor 202, 204, 206, pressure sensor stability can be further improved by modifying or varying the geometry of electrodes 202, 204 of the MTJ core pressure sensor 202, 204, 206. For example, variables such as the aspect ratio, relative orientation, size and shape of the electrodes 202, 204 of the MTJ core pressure sensor 202, 204, 206 can be varied.

Figure 10:
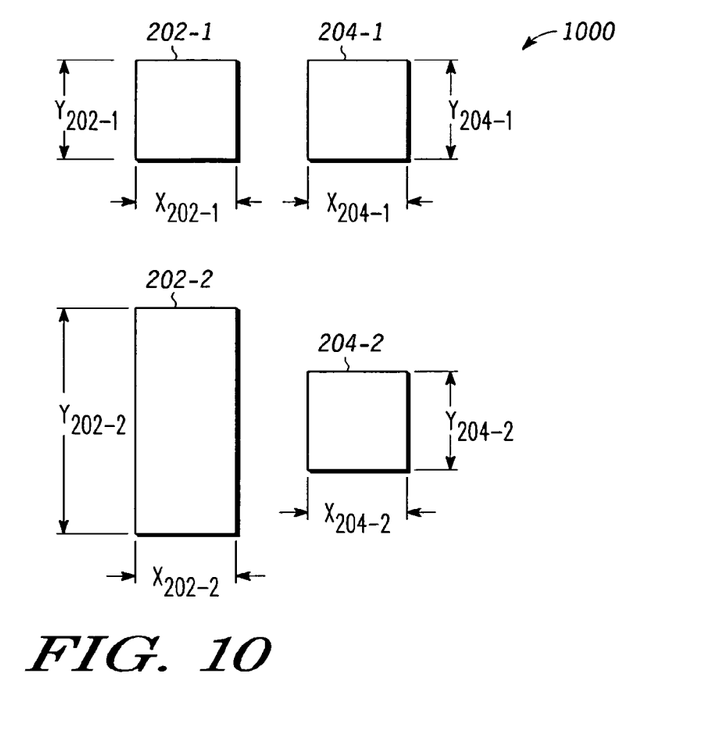
FIG. 10 is an exploded plan view of the electrodes of a MTJ configured according to exemplary embodiments.

FIG. 10 is an exploded plan view 1000 of the electrodes 202, 204 of an MTJ core pressure sensor 202, 204, 206 configured according to exemplary embodiments where at least one of the electrodes is square. Electrodes 202, 204 are shown as being laterally displaced in FIG. 10 so that their relative shape and size may be more easily seen. However, when assembled to form MTJ core pressure sensor 202, 204, 206, they lie one above the other, that is, electrode 204 above electrode 202. Electrodes 202-1, 204-1 are shown as being substantially square, that is having X and Y dimensions $Y_{202-1} = X_{202-1} = Y_{204-1} = X_{204-1}$. For convenience of explanation, this is the representation that has been used up to now for the most part, but that is not essential. Electrodes 202-2, 204-2 are different with electrode 202-2 being rectangular with $Y_{202-2} > X_{202-2}$ and $Y_{204-2} = X_{204-2}$. Again, this is intended merely to be illustrative of various possible shapes of the electrodes and not to be exhaustive or limiting.

Figure 11:
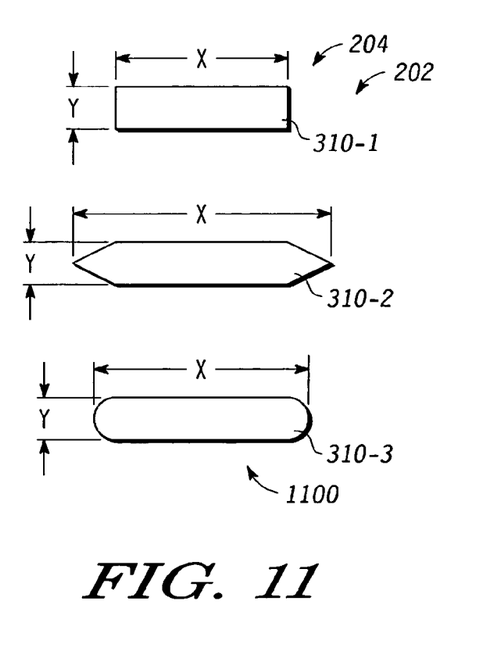
FIG. 11 is an exploded plan view of the electrodes of a MTJ configured according to other exemplary embodiments.

FIG. 11 is an exploded plan view 1100 of the electrodes 202, 204 of a MTJ configured according to other exemplary embodiments where either or both electrodes 202, 204 have various exemplary, non-square, shapes. For example, in 310-1, either or both of electrodes 202, 204 are rectangular and elongated with dimension X significantly greater then Y, in 310-2, either or both of electrodes 202, 204 are elongated with X>>Y and with triangular ends, and in 310-3, either or both of electrodes 202, 204 are elongated with X>>Y and with rounded ends. When electrodes are placed one above the other to form MTJ core pressure sensor 202, 204, 206, their longer dimensions may make various angles with respect to each other, as is illustrated schematically in FIG. 12. It is useful under certain circumstances to use electrode shapes that are significantly asymmetric since the plan view asymmetry in thin electrodes affects the ease or difficulty with which the electron spin axes may be rotated. For example, although the electron spin axes in the first electrode can be pinned by heat treatment in the presence of a magnetic field, another approach is to make the electrode shape highly asymmetric, e.g., long and narrow in plan view, since it is very difficult to rotate the electron spin axes away from the long direction of such an asymmetric shape. However, either arrangement for pinning the spin axes may be used.

Figure 12:
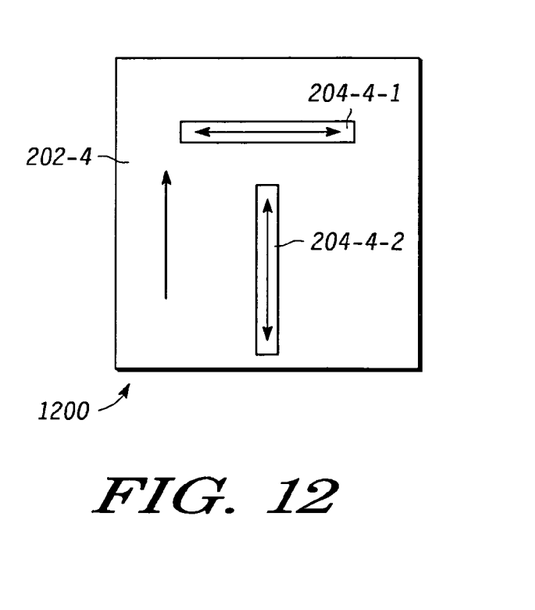
FIG. 12 is a plan view of an arrangement of the electrodes of a MTJ configured according to yet other exemplary embodiments.

FIG. 12 shows plan view 1200 of an arrangement of the electrodes 202, 204 of a MTJ configured according to yet other exemplary embodiments where at least one of the electrodes 202, 204 has various angular arrangements with respect to the other electrode. For convenience of illustration, as illustrated by the arrowing point toward the top of the page, the pin layer electrode 202-4 is shown as a single continuous electrode having a magnetization vector pinned along the vertical direction.

The free layer electrodes 204-4-1 and 204-4-2 can be arranged at different angles with respect to the pin layer electrode 202-4. For instance, the free layer electrode 204-4-1 is oriented with its long dimension substantially orthogonal to the long dimension of pin layer electrode 202-4, whereas the free layer electrode 204-4-2 is oriented with its long dimension substantially parallel with the long dimension of pin layer electrode 202-4. These different relative angular orientations can allow the MTJ core to operate in one of two modes known as an analog mode and a switching mode. For example, the free layer electrode 204-4-1 has a magnetization vector which is substantially orthogonal with respect to the magnetization vector of the pin layer electrode 202-4, whereas the free layer electrode 204-4-2 has a magnetization vector which is substantially parallel or anti-parallel with respect to the magnetization vector of the pin layer electrode 202-4. In other embodiments, the pin layer electrode 202-4 can be composed of separate segments, each underlying a single one of the free layer electrodes 204-4-1 and 204-4-2.

Figure 13:
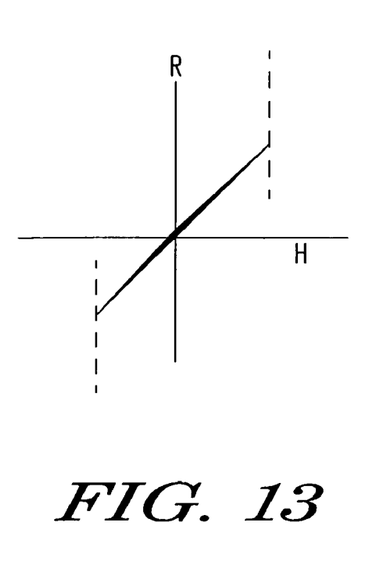
FIG. 13 is a chart illustrating MTJ output resistance with respect to changing pressure experienced by an MTJ pressure sensor operating in an analog mode.

FIG. 13 is a chart illustrating MTJ output resistance (Rout) of an MTJ core operating in an analog mode. In FIG. 13, the x-axis corresponds to magnetic filed (H) sensed by the MTJ core while the y axis corresponds to MTJ output resistance (Rout). In analog mode, the MTJ output resistance (Rout) varies continuously with the mutual angle. Instead of the sharp switching between high and low resistance, the MTJ output resistance (Rout) increases and decreases continuously with the mutual angle. This is because the magnetization vector (e.g., atom spin direction) of the free layer electrode 204-4-1 with respect to the magnetization vector of the pin layer electrode 202-4 can change or rotate continuously.

Figure 14:
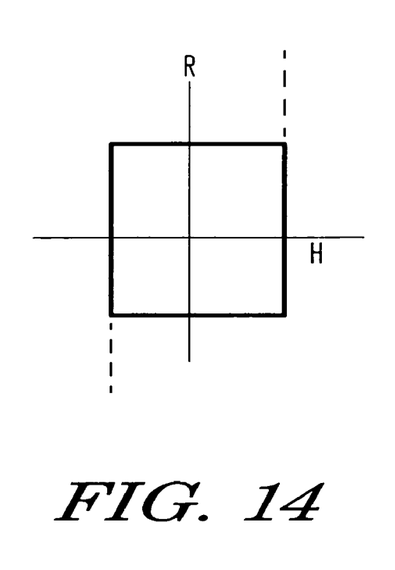
FIG. 14 is a chart illustrating MTJ output resistance with respect to changing pressure experienced by the MTJ pressure sensor operating in a switching mode.

FIG. 14 is a chart illustrating MTJ output resistance of an MTJ core operating in a switching mode. In FIG. 14, the x-axis corresponds to magnetic filed (H) sensed by the MTJ core while the y axis corresponds to MTJ output resistance (Rout). As noted above, in a conventional toggle application, the orientation of the magnetization in free layer rotates in response to applied current pulses from the digit and bit lines, and makes a complete 180 degree reversal when pulses are simultaneously applied by both digit and bit line. In a typical non-toggle application, the orientation of the bit is switched by reversing the polarity of the current in bit line while keeping a constant polarity of the current in digit line. In this switching mode, if the mutual angle is at 180 degrees, the MTJ switches to a relatively high resistance state, and when the mutual angle is at 0 degrees, the MTJ switches to a relatively low resistance state. In switching mode, the MTJ has only two states which correspond to either 0 degrees or 180 degrees. As such, the only concern is with whether the magnetization orientation in the free layer is parallel or anti-parallel. A parallel state outputs a low MTJ output resistance (Rout) while the anti-parallel state outputs a high MTJ output resistance (Rout).

The switching MTJ and the analog MTJ are fabricated in different ways. The initial state of the switching MTJ can be at either a 0 or 180 degree mutual angle. On the other hand, the analog MTJ has an initial state of 90 degrees.

In summary, integrated circuit devices, and pressure sensing methods in accordance with example embodiments of the invention relate to an integrated circuit device is provided which comprises a substrate, a conductive line configured to experience a pressure, and a magnetic tunnel junction ("MTJ") core formed between the substrate and the current line. The conductive line is configured to move in response to the pressure, and carries a current which generates a magnetic field. The MTJ core has a resistance value which varies based on the magnetic field. The resistance of the MTJ core therefore varies with respect to changes in the pressure. The MTJ core is configured to generate a current which varies as a function of the pressure.

In another implementation, an integrated circuit device is provided which comprises a conductive line, a magnetic tunnel junction ("MTJ") core, and a pressure sensor circuit. The conductive line configured to move in response to change in a pressure experienced by the conductive line. The MTJ core has a resistance value which varies as a function of the pressure, and is configured to generate a current which varies based on the resistance value of the MTJ core. The pressure sensor circuit is configured to associate a value of the current generated by the MTJ core with a pressure value experienced by the conductive line.

In another implementation, an integrated circuit device is provided which comprises a substrate, a first insulating layer having a magnetic tunnel junction ("MTJ") core formed therein, and a second insulating layer. The substrate is formed from front end layers by a front end fabrication process, and the MTJ core is formed from back end layers by a back end fabrication process which occurs after the front end fabrication process. The second insulating layer can be disposed over the first insulating layer, and has a conductive line disposed therein. The second insulating layer also defines a cavity therein. At least a portion of the cavity is disposed between the conductive line and the MTJ core. The conductive line is configured to produce a magnetic field.

A resistance value of the magnetic tunnel junction core varies with changes in the magnetic field experienced by the MTJ core. When the second insulating layer flexes in response to pressure applied to the second insulating layer a distance between the conductive line and the MTJ core also changes. As a result, the resistance value of the magnetic tunnel junction core changes in response to pressure experienced by the second insulating layer, and varies with respect to the distance between the conductive line and the MTJ core.

The MTJ core is configured to sense the pressure and generate a current, responsive to the pressure, which varies based on the resistance value of the MTJ core. The current of the MTJ core can used to determine the pressure experienced by the second insulating layer. For example, in one implementation, a pressure sensor conversion circuit is used to associate the current generated by the MTJ core with the pressure experienced by the second insulating layer.

A method of sensing pressure in an integrated circuit is also provided. The integrated circuit can comprise, for example, a magnetic tunnel junction ("MTJ") core having a resistance value, a conductive line configured to produce a magnetic field, and a cavity is defined between the conductive line and the MTJ core. In one implementation, the integrated circuit can also optionally include, for example, a substrate having the magnetic tunnel junction ("MTJ") core formed therein, and a deformable diaphragm defining the cavity and having the conductive line therein.

According to this method, the conductive line is exposed to a pressure. For example, in one exemplary implementation, at least a portion of the deformable diaphragm flexes in response to the pressure such that the distance between the conductive line and the MTJ core varies based on the pressure experienced by the deformable diaphragm. This causes the magnetic field experienced by the MTJ core to change in response to the pressure.

Thereafter, a corresponding pressure value can be determined based on the resistance value of the MTJ core. The corresponding pressure value is indicative of the pressure. The resistance value of the MTJ core varies with respect to the distance between the conductive line and the MTJ core, and also varies with respect to changes in the magnetic field experienced by the MTJ core. As such, a corresponding pressure value can be determined based on the resistance value, for example, by measuring a current generated by the MTJ core, wherein the current generated by the MTJ core varies based on the resistance value of the MTJ core; correlating the current generated by the MTJ core with a resistance value of the MTJ core; and associating the resistance value of the magnetic tunnel junction core with a corresponding pressure value. The corresponding pressure value is indicative of the pressure.

According to another embodiment, a method of producing an integrated circuit can be provided which comprises the steps of providing a substrate; providing a first insulating layer on the substrate, the first insulating layer having a magnetic tunnel junction ("MTJ") core formed therein; providing a sacrificial layer on the first insulating layer over the MTJ core; forming a conductive line on the sacrificial layer, wherein the conductive line is configured to produce a magnetic field; forming a second insulating layer over the conductive line and the sacrificial layer such that the second insulating layer surrounds at least a portion of the sacrificial layer; and removing the sacrificial layer to define a cavity between the conductive line and the MTJ core, wherein at least a portion of the second insulating layer is configured to flex in response to pressure applied to the second insulating layer. A distance between the conductive line and the MTJ core varies based on the pressure experienced by the second insulating layer, and the magnetic field experienced by the MTJ core changes in response to the pressure. A resistance value of the particular magnetic tunnel junction core varies with respect to the distance between the conductive line and the MTJ core. The resistance value of the magnetic tunnel junction core varies with changes in the magnetic field experienced by the MTJ core.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. An integrated circuit device, comprising:
    a substrate;
    a first insulating layer having a magnetic tunnel junction ("MTJ") core formed therein;
    a second insulating layer, disposed over the first insulating layer, the second insulating layer having a conductive line disposed therein and defining a cavity therein, wherein the conductive line is configured to carry a first current that produces a first magnetic field, and wherein at least a portion of the cavity is disposed directly between the conductive line and the MTJ core and wherein a resistance value of the MTJ core varies with changes in the first magnetic field experienced by the MTJ core.

2. An integrated circuit device according to claim 1, wherein the second insulating layer flexes in response to pressure applied to the second insulating layer and wherein the resistance value of the MTJ core changes in response to pressure experienced by the second insulating layer.

3. An integrated circuit device according to claim 2, wherein a distance between the conductive line and the MTJ core varies based on the pressure experienced by the second insulating layer, and wherein the resistance value of the MTJ core varies with respect to the distance between the conductive line and the MTJ core.

4. An integrated circuit device according to claim 3, wherein the MTJ core is configured to sense the pressure and generate an electrical output signal responsive to the pressure.

5. An integrated circuit device according to claim 4, wherein the electrical output signal generated by the MTJ core varies based on the resistance value of the MTJ core.

6. An integrated circuit device according to claim 5, wherein the electrical output signal of the MTJ core is used to determine the pressure experienced by the second insulating layer.

7. An integrated circuit device according to claim 6, further comprising:
    a pressure sensor conversion circuit configured to associate the electrical output signal produced by the MTJ core with the pressure experienced by the second insulating layer.

8. An integrated circuit device according to claim 1, wherein the substrate is formed from front end layers by a front end fabrication process, wherein the MTJ core is formed from back end layers by a back end fabrication process which occurs after the front end fabrication process.

9. An integrated circuit device, comprising:
    an insulating layer having;
    a conductive line configured to carry a first current that generates a first magnetic field, wherein the conductive line moves in response to change in a pressure experienced by the conductive line;
    a magnetic tunnel junction ("MTJ") core having a resistance value which varies as a function of the first magnetic field experienced by the MTJ core, and being configured to generate an electrical output signal which varies based on the resistance value of the MTJ core;
    wherein the insulating layer defines a cavity and at least a portion of the cavity is disposed directly between said conductive line and said MTJ core; and
    a pressure sensor circuit configured to associate a value of the electrical output signal produced by the MTJ core with a pressure value experienced by the conductive line.

10. A pressure sensor apparatus, comprising:
    a substrate;
    a first insulating layer formed overlying the substrate;
    a magnetic tunnel junction (MTJ) core formed in the first insulating layer;
    a second insulating layer comprising: a deformable diaphragm that is designed to move in response to pressure applied thereto, and a cavity defined in the second insulating layer, wherein the MTJ core is disposed below the cavity; and
    a programming bit line at least partially embedded in the deformable diaphragm and suspended over a portion of the cavity, wherein at least a portion of the cavity is disposed directly between the programming bit line and the MTJ core and wherein the programming bit line carries a first current that generates a first magnetic field, wherein the deformable diaphragm moves in response to pressure applied thereto such that a vertical distance between the programming bit line and the MTJ core changes with changes in the pressure applied to deformable diaphragm which changes the first magnetic field experienced by the MTJ core.

11. A pressure sensor apparatus according to claim 10, wherein the MTJ core generates an output current that varies based on changes in the output tunneling magnetic resistance (TMR) of the MTJ core, and wherein the output tunneling magnetic resistance (TMR) of MTJ core varies with changes in the pressure depending on the vertical distance between MTJ core and programming bit line, and wherein the output current generated by the MTJ core correlates to the pressure applied to the deformable diaphragm.

12. A pressure sensor apparatus according to claim 10, wherein the programming bit line is suspended over the cavity by the deformable diaphragm.

13. A pressure sensor apparatus according to claim 10, wherein the MTJ core comprises:
  a ferromagnetic free layer in which a first magnetization orientation is rotatable such that the first magnetization orientation is designed to change in both magnitude and direction;
  a ferromagnetic pinned layer in which a second magnetization orientation is fixed in one direction such that a mutual angle of the first magnetization orientation is rotatable with respect to the second magnetization orientation of the pinned layer, and
    wherein changes in a first magnetic field experienced by the MTJ core changes the mutual angle between the ferromagnetic pinned layer and the ferromagnetic free layer of the MTJ core, and wherein changes in the mutual angle change the output tunneling magnetic resistance (TMR) of the MTJ core such that an output current of the MTJ core varies with changes in pressure;
  a tunnel barrier layer disposed between the ferromagnetic free layer and the ferromagnetic pinned layer, wherein the tunnel baffler layer tunnels an output current from the pinned layer to the free layer;
  a first electrode layer below the pinned layer; and
  a second electrode layer above the free layer.

14. A pressure sensor apparatus according to claim 13, wherein changes in a relative position of the programming bit line with respect to the MTJ core changes the mutual angle between the free layer and the pinned layer which changes the output TMR of the MTJ core, wherein the first and second magnetizations are oriented in the same direction during a parallel state and in opposite directions during an anti-parallel state.

15. A pressure sensor apparatus according to claim 14, wherein the mutual angle between the ferromagnetic free layer and the ferromagnetic pinned layer is approximately 0° during the parallel state to result in a low output tunneling magnetic resistance (TMR) of the MTJ core, and wherein the mutual angle between the ferromagnetic free layer and the ferromagnetic pinned layer is approximately 180° during the anti-parallel state to result in a high output tunneling magnetic resistance (TMR) of the MTJ core.

16. A pressure sensor apparatus according to claim 10, wherein the pressure sensor apparatus comprises a plurality of front end layers further comprising:
  an active circuit embedded in the substrate;
  a third insulating layer overlying the active circuit, wherein the second insulating layer overlies the third insulating layer; and
  a programming digit line that carries a second current that generates a second magnetic field that is sensed by the MTJ core, wherein the programming digit line is embedded in the third insulating layer and wherein the second magnetic field experienced by the MTJ core is dependent upon the second current running through the programming bit line.

17. A pressure sensor apparatus according to claim 16, wherein the active circuit comprises:
  an analog active circuit component.

18. A pressure sensor apparatus according to claim 10, further comprising: a pressure sensor conversion circuit that measures the output current, determines a corresponding output TMR of the MTJ core, and associates the corresponding output TMR with a corresponding sensed pressure value indicative of the pressure experienced by the deformable diaphragm.

19. A pressure sensor apparatus according to claim 18, further comprising:
  a processor that uses the corresponding sensed pressure value to control operation of the active circuit.

20. A pressure sensor apparatus according to claim 10, further comprising:
  a magnetic shielding layer disposed above the deformable diaphragm to protect an output current generated by the MTJ core from external noise generated by sources adjacent the MTJ core that produce magnetic fields.

* * * * *

UNITED STATES PATENT AND TRADEMARK OFFICE
CERTIFICATE OF CORRECTION

PATENT NO. : 7,547,480 B2
APPLICATION NO. : 11/262064
DATED : June 16, 2009
INVENTOR(S) : Young Sir Chung et al.

It is certified that error appears in the above-identified patent and that said Letters Patent is hereby corrected as shown below:

Col. 21, Line 40 "baffler" should be changed to --barrier--.

Signed and Sealed this

Third Day of November, 2009

David J. Kappos
*Director of the United States Patent and Trademark Office*